United States Patent
Tsai et al.

(10) Patent No.: US 8,309,966 B2
(45) Date of Patent: Nov. 13, 2012

(54) GATE DRIVER ON ARRAY OF A DISPLAY

(75) Inventors: Tung-Chang Tsai, Hsin-Chu (TW);
Lee-Hsun Chang, Hsin-Chu (TW);
Ming-Chang Shih, Hsin-Chu (TW);
Jing-Ru Chen, Hsin-Chu (TW);
Kuei-Sheng Tseng, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 115 days.

(21) Appl. No.: 12/898,727

(22) Filed: Oct. 6, 2010

(65) Prior Publication Data

US 2011/0018001 A1    Jan. 27, 2011

Related U.S. Application Data

(62) Division of application No. 12/206,746, filed on Sep. 9, 2008, now Pat. No. 8,053,288.

(30) Foreign Application Priority Data

Apr. 18, 2008 (TW) ................................ 97114245 A

(51) Int. Cl.
*H01L 29/786* (2006.01)
(52) U.S. Cl. ... 257/72; 438/158; 438/159; 257/E21.414; 257/E29.291; 257/E29.294; 257/E31.032
(58) Field of Classification Search .................. 438/158, 438/159, 164, 151; 257/72, E21.414, E29.291, 257/E29.294, E31.032
See application file for complete search history.

(56) References Cited

U.S. PATENT DOCUMENTS

| | | | |
|---|---|---|---|
| 4,459,739 A * | 7/1984 | Shepherd et al. | 438/157 |
| 5,949,502 A * | 9/1999 | Matsunaga et al. | 349/40 |
| 6,255,130 B1 | 7/2001 | Kim | |
| 6,459,124 B1 * | 10/2002 | Zhang et al. | 257/347 |
| 6,528,360 B2 * | 3/2003 | Zhang et al. | 438/154 |
| 6,562,645 B2 * | 5/2003 | Sung et al. | 438/30 |
| 6,849,873 B2 | 2/2005 | Baek | |
| 6,876,428 B2 | 4/2005 | Kwak | |
| 6,924,869 B2 * | 8/2005 | Yu | 349/152 |
| 7,279,371 B2 * | 10/2007 | Kim | 438/158 |
| 7,416,926 B2 * | 8/2008 | Heo | 438/153 |
| 7,947,984 B2 * | 5/2011 | Jang et al. | 257/72 |
| 8,053,288 B2 * | 11/2011 | Tsai et al. | 438/149 |
| 2001/0019125 A1 | 9/2001 | Hong | |
| 2005/0142681 A1 | 6/2005 | Soh | |
| 2005/0263768 A1 | 12/2005 | Ahn | |
| 2006/0008932 A1 | 1/2006 | Oh | |
| 2006/0017681 A1 * | 1/2006 | Jang et al. | 345/98 |

(Continued)

FOREIGN PATENT DOCUMENTS

CN    1767175 A    5/2006

(Continued)

*Primary Examiner* — Mary Wilczewski
(74) *Attorney, Agent, or Firm* — Winston Hsu; Scott Margo

(57) ABSTRACT

A gate driver on array of a display includes a substrate having a peripheral region, and a gate driver on array structure formed in the peripheral region. The gate driver on array structure includes a pull-down transistor, and the pull-down transistor has a gate electrode, an insulating layer, a semiconductor island, a source electrode, and a drain electrode. The semiconductor island extends out of both edges of the gate electrode, and extends out of an edge of the source electrode and an edge of the drain electrode.

12 Claims, 15 Drawing Sheets

U.S. PATENT DOCUMENTS

| | | |
|---|---|---|
| 2006/0022199 A1 | 2/2006 | Ishiga |
| 2006/0073645 A1 | 4/2006 | Lee |
| 2006/0175611 A1 | 8/2006 | Tanaka |
| 2007/0138471 A1 | 6/2007 | Lim |
| 2007/0164330 A1 | 7/2007 | Jeong |
| 2007/0216822 A1* | 9/2007 | Ishige et al. .................... 349/39 |
| 2007/0249169 A1 | 10/2007 | Soh |
| 2008/0003726 A1 | 1/2008 | Park |
| 2010/0026669 A1* | 2/2010 | Lee et al. ..................... 345/204 |

FOREIGN PATENT DOCUMENTS

| | | | |
|---|---|---|---|
| JP | 2-219239 | * | 8/1990 |
| JP | 2-219240 | * | 8/1990 |
| TW | 200727485 | | 7/2007 |

* cited by examiner

GATE DRIVER ON ARRAY OF A DISPLAY

CROSS REFERENCE TO RELATED APPLICATIONS

This application is a division of application Ser. No. 12/206,746 filed on Sep. 9, 2008.

BACKGROUND OF THE INVENTION

1. Field of the Invention

The present invention relates to a gate driving circuit of a display, and a method of fabricating a device of a display, and more particularly, to a pull-down module of a gate driver on array (GOA) having high pull-down ability, and a method of making a device of a display capable of avoiding metal loss.

2. Description of the Prior Art

FIG. 1 illustrates a circuit diagram of a gate driving circuit of a display. As shown in FIG. 1, the gate driving circuit is used to generate pulse signals according to a predetermined timing sequence, and the pulse signals are delivered to gate lines so as to control switching of the thin film transistors (TFTs) in the pixel regions of the display. The gate driving circuit mainly includes a plurality of signal lines (e.g. L1, L2, L3 and L4), and a plurality of TFTs (e.g. T1, T2, T3 and T4). The signal line L1 is used to deliver a voltage signal Vss, the signal line L2 is used to deliver a start pulse signal Vst, the signal line L3 is used to deliver a complementary clock signal Vxck, and the signal line L4 is used to deliver a clock signal Vck. The TFT T1 serves as a starting switch, and the TFT T2 serves as a pulse switch. When the start pulse signal Vst turns on the TFT T1, the TFT T2 is also turned on so that clock signal Vck can pass and provide a voltage signal $V_N$ to the $N_{th}$ gate line of the display panel. The TFTs T3, T4 serve as a pull-down module, which pulls down the voltage of the signal delivered to the gate line to a reference voltage, i.e. the level of the voltage signal Vss, for example −6V. Specifically, the TFT T4 can pull down the voltage of the node Q1 to the level of the voltage signal Vss, and the TFT T3 can pull down the voltage of the node Q2 to the level of the voltage signal Vss.

The conventional TFTs T3, T4 cannot provide pull-down effect when turned off. However, the start pulse voltage Vst or the clock signal Vck may have abnormal waveform during this period of time, and consequently the TFTs of the pixel regions may be turned on falsely. Thus, the pull-down ability of the conventional pull-down module requires to be improved.

Also, in the conventional photolithography process of display fabrication, for example 4PEP array processes, the size of the metal pattern actually formed is usually found smaller than its original designed size. This is so called metal loss, and the metal loss problem is serious particularly in patterning the second metal layer (Metal 2). This metal loss problem influences the reliability of the TFTs of pixel regions, the TFTs of gate driver on array (GOA), and other components e.g. photo spacer stages.

SUMMARY OF THE INVENTION

It is therefore one of the objectives of the present invention to provide a gate driver on array of a display, and a method of forming a device of a display to solve the aforementioned problem.

According to the present invention, a method of forming a device of a display is provided. The method includes the following steps. First of all, a substrate is provided. Then, a first conductive layer on the substrate, and patterned to form a first conductive structure. An insulating layer, a semiconductor layer, an ohmic contact layer, a second conductive layer, and a photoresist pattern are consecutively formed on the first conductive structure. The photoresist pattern includes a first thickness region, and a second thickness region outside the first thickness region, and a thickness of the second thickness region is smaller than a thickness of the first thickness region.

According to the present invention, a gate driver on array of a display is also provided. The gate driver on array includes a substrate, and a gate driver on array structure. The substrate includes a peripheral region. The gate driver on array structure is disposed in the peripheral region. The gate driver on array structure includes a pull-down transistor, and the pull-down transistor includes a gate electrode, an insulating layer, a semiconductor island, a source electrode, and a drain electrode. The semiconductor island extends out of both edges of the gate electrode, and extends out of an edge of the source electrode and an edge of the drain electrode.

The semiconductor island of the pull-down transistor of the display extends out of the gate electrode, and also the source electrode and the drain electrode, and thus improves the pull-down ability. In addition, the method of the present invention uses a photoresist pattern with different thickness to perform photolithographic and etching processes for forming the pull-down transistor and photo spacer stage of the display, and therefore metal loss problem is diminished.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
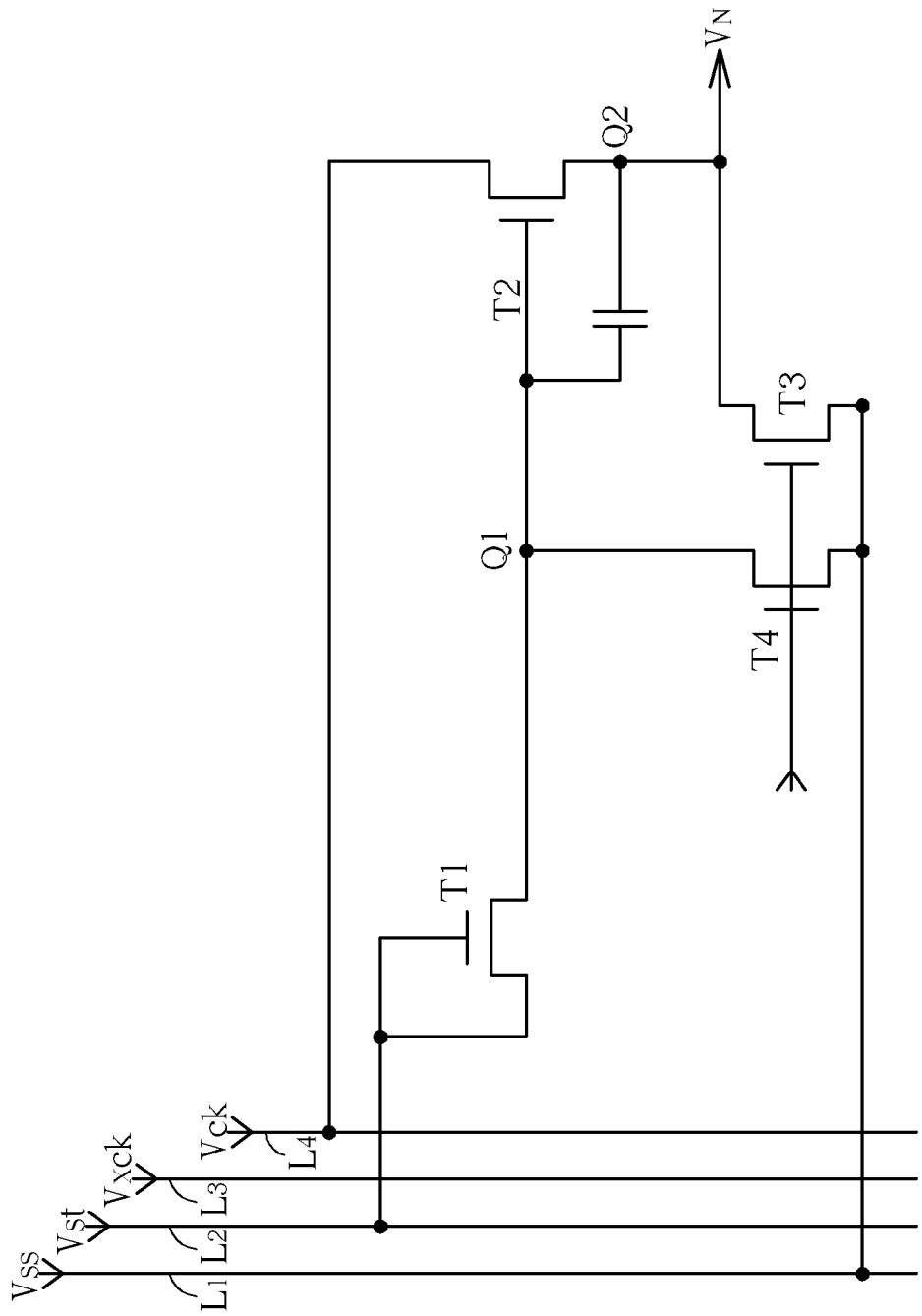
FIG. 1 illustrates a circuit diagram of a gate driving circuit of a display.
Figure 2:
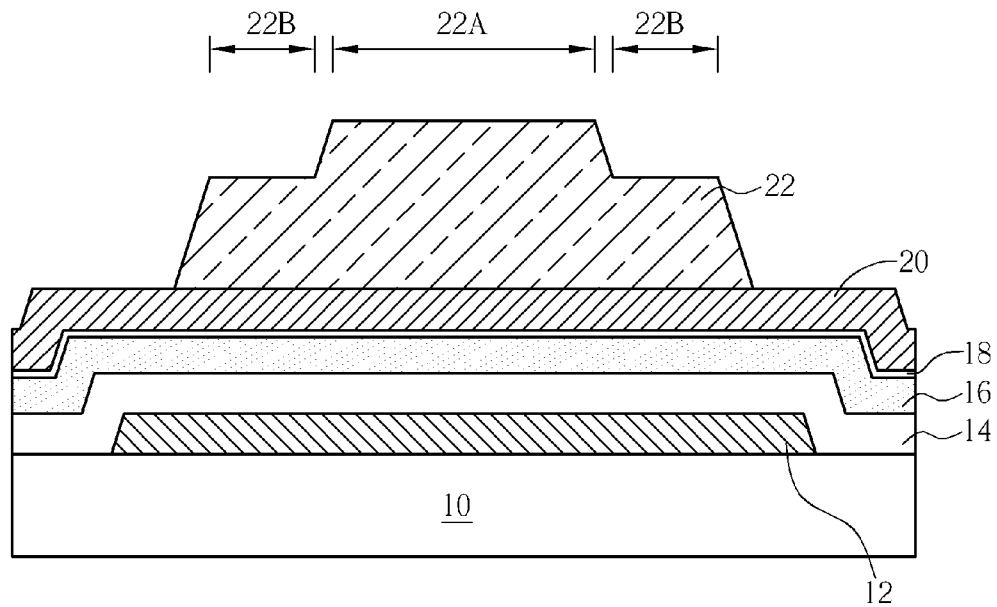
FIGS. 2-6 illustrate a method of forming a photo spacer stage of a display according to a preferred embodiment of the present invention.

FIGS. 2-6 illustrate a method of forming a photo spacer stage of a display according to a preferred embodiment of the present invention. As shown in FIG. 2, a substrate 10 is provided. In this embodiment, the substrate 10 is a thin film transistor substrate (TFT substrate) of an LCD panel, but not limited. Then, a first conductive layer is formed on the substrate 10, and the first conductive layer is patterned by photolithographic and etching techniques to form a first conductive structure 12. Subsequently, an insulating layer 14, a semiconductor layer 16, an ohmic contact layer 18, a second conductive layer 20 and a photoresist pattern 22 are consecutively formed on the first conductive structure 12. In this embodiment, the first conductive structure 12 and the second conductive layer 20 are made of metal material. The photoresist pattern 22 includes a first thickness region 22A, and a second thickness region 22B outside the first thickness region 22A, where the thickness of the second thickness region 22B is smaller than the thickness of the first thickness region 22A. In this embodiment, the thickness of the first thickness region 22A is substantially between 1.5 and 2.5 microns, and the thickness of the second thickness region 22B is substantially between 5000 and 6000 angstroms, but not limited. In addition, the photoresist pattern 22 may be patterned by exposing with a graytone mask such as a halftone mask or a phase shift mask, but not limited.

Figure 3:
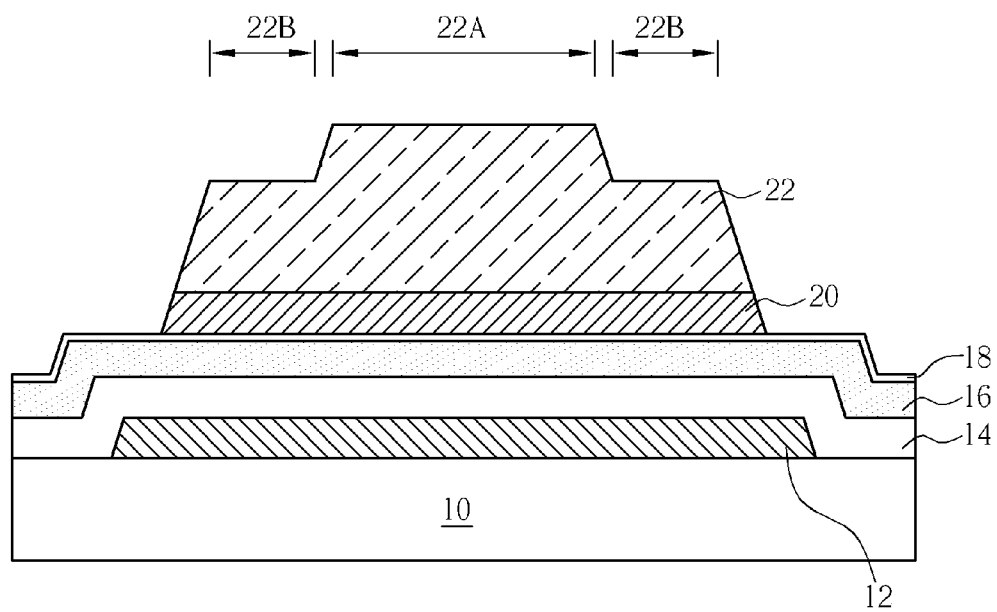

As shown in FIG. 3, the photoresist pattern 22 is used as an etching mask to perform a wet etching process on a part of the second conductive layer 20 not covered by the photoresist pattern 22, and another part of the second conductive layer 20 covered by the photoresist pattern 22 is remained.

Figure 4:
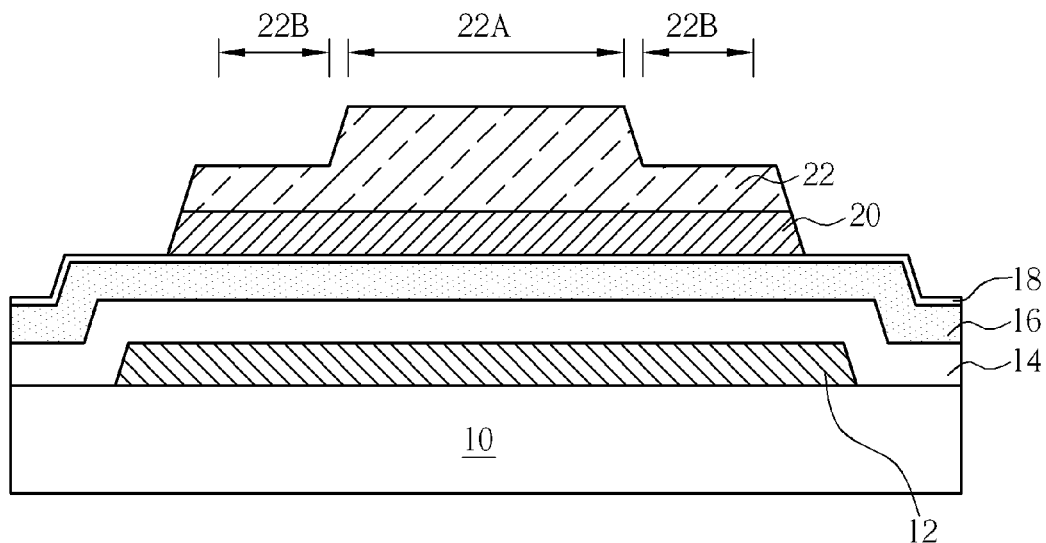

Subsequently, as shown in FIG. 4, an ashing (photoresist ashing, PR ashing) process is implemented to partially remove the photoresist material to thin or to reduce the thickness of the photoresist pattern 22. After the ashing process, the thickness of the second thickness region 22B is still smaller than the thickness of the first thickness region 22A. In this embodiment, the thickness of the second thickness region 22B of the photoresist pattern 22 is reduced to avoid metal loss of the second conductive layer 20, but the dimension of the photoresist pattern 22 is not changed. In other embodiments of the present invention, however, the ashing process may be carried out by dry etching, for instance, and the dimension and thickness of the second thickness region 22B may be changed. For example, the dimension of the second thickness region 22B of the photoresist pattern 22 can be reduced, or the second thickness region 22B may be removed so as to control the metal loss.

Figure 5:
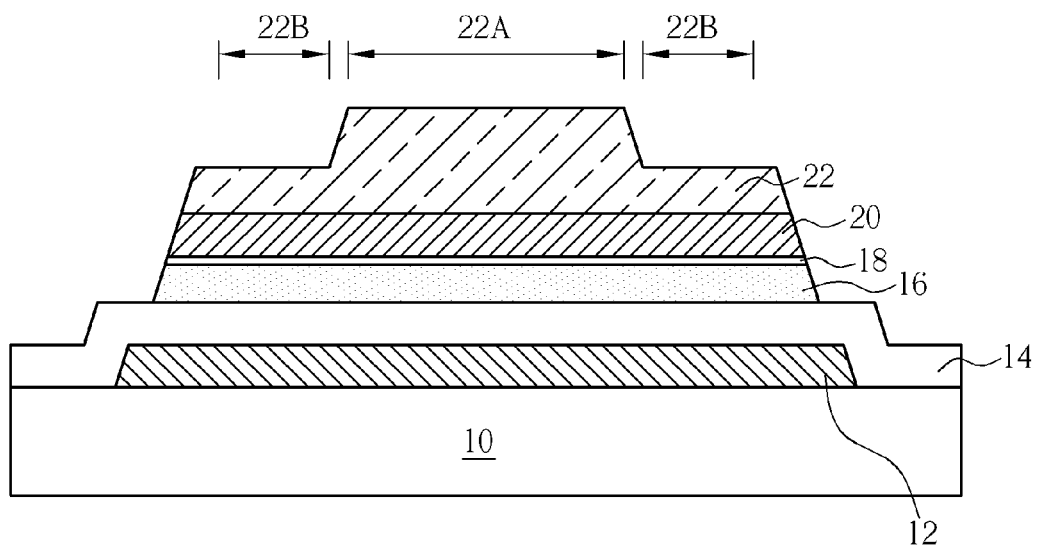

As shown in FIG. 5. a dry etching process is performed using the photoresist pattern 22 and the second conductive layer 20 as an etching mask to dry etch a part of the ohmic contact layer 18 and a part of the semiconductor layer 16 not covered by the photoresist pattern 22 and the second conductive layer 20.

Figure 6:
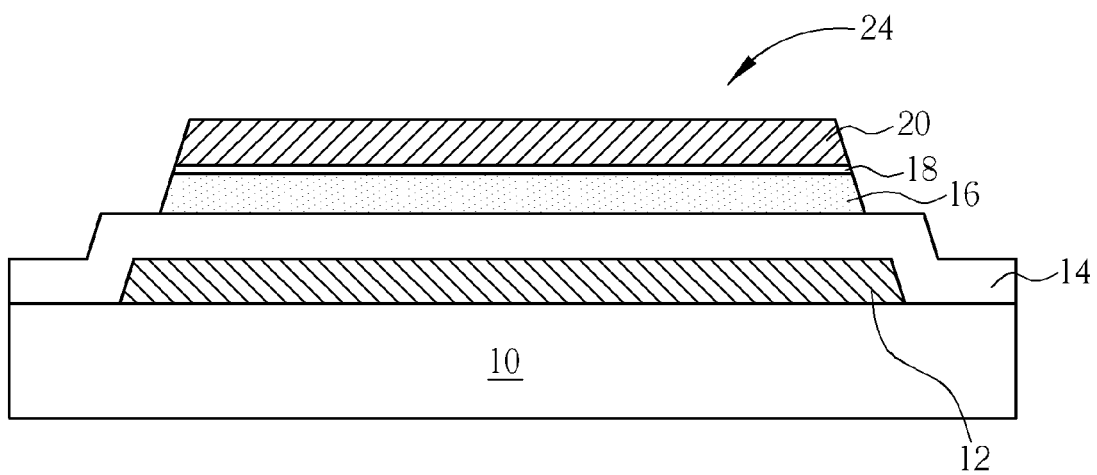

As shown in FIG. 6, a PR strip process is performed by e.g. dry etching or wet etching to remove the photoresist pattern 22. Accordingly, a photo spacer stage 24 composed of the first conductive structure 12, the insulating layer 14, the semiconductor layer 16, the ohmic contact layer 18 and the second conductive layer 22 stacked up is formed.

Figure 7:
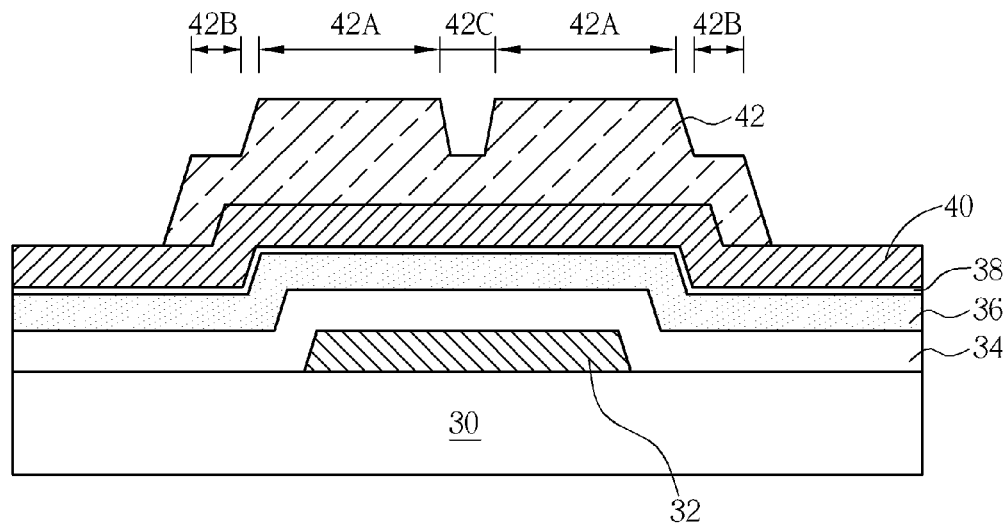
FIGS. 7-13 illustrate a method of forming a pull-down transistor of a GOA of a display according to another embodiment of the present invention.

FIGS. 7-13 illustrate a method of forming a pull-down transistor of a gate driver on array (GOA) of a display according to another embodiment of the present invention. The GOA is a gate driving circuit formed on the substrate of the display. As shown in FIG. 7, a substrate 30 is provided. A first conductive layer is formed on the substrate 30, and patterned by photolithographic and etching techniques to form a first conductive structure 32 which serves as a gate electrode. Subsequently, an insulating layer 34, a semiconductor layer 36, an ohmic contact layer 38, a second conductive layer 40, and a photoresist pattern 42 are consecutively formed on the first conductive structure 32. In this embodiment, the first conductive structure 32 and the second conductive layer 40 are made of metal material, and the insulating layer 34 serves as a gate insulating layer. The photoresist pattern 42 includes a first thickness region 42A, a second thickness region 42B outside the first thickness region 42A, and a third thickness region 42C substantially corresponding to a central part of the first conductive structure 32. Preferably, the thickness of the second thickness region 42B and the thickness of the third thickness region 42C are smaller than the thickness of the first thickness region 42A, and the thickness of the second thickness region 42B and the thickness of the third thickness region 42C are approximately the same, but not limited. In this embodiment, the thickness of the first thickness region 42A is substantially between 1.5 and 2.5 microns, the thickness of the second thickness region 42B and the third thickness region 42C are both substantially between 5000 and 6000 angstroms, but not limited. In addition, the photoresist pattern 42 may be formed by exposing with a graytone mask such as a halftone mask or a phase shift mask, but not limited.

Figure 8:
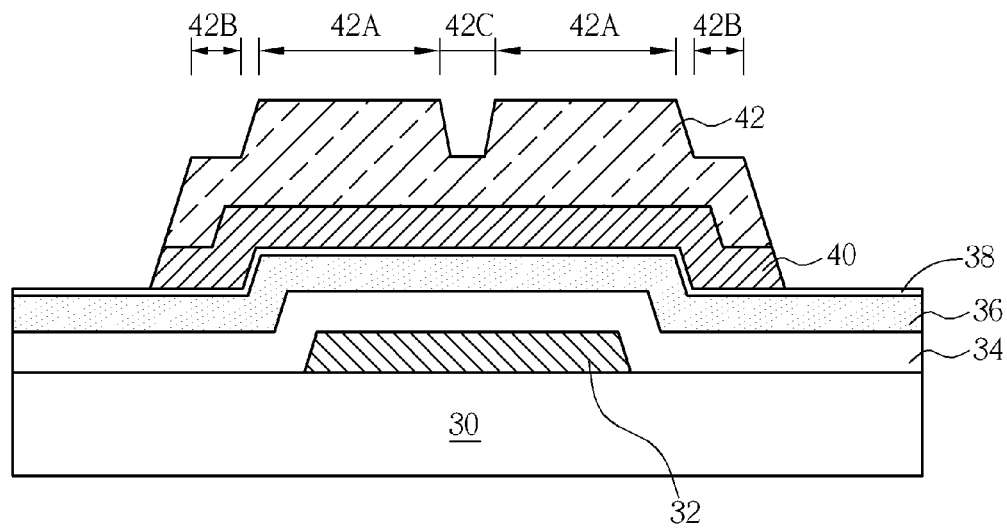

As shown in FIG. 8, a wet etching process is performed using the photoresist pattern 42 as an etching mask to etch a part of the second conductive layer 40 not covered by the photoresist pattern 42, while another part of the second conductive layer 40 covered by the photoresist pattern 42 is remained.

Figure 9:
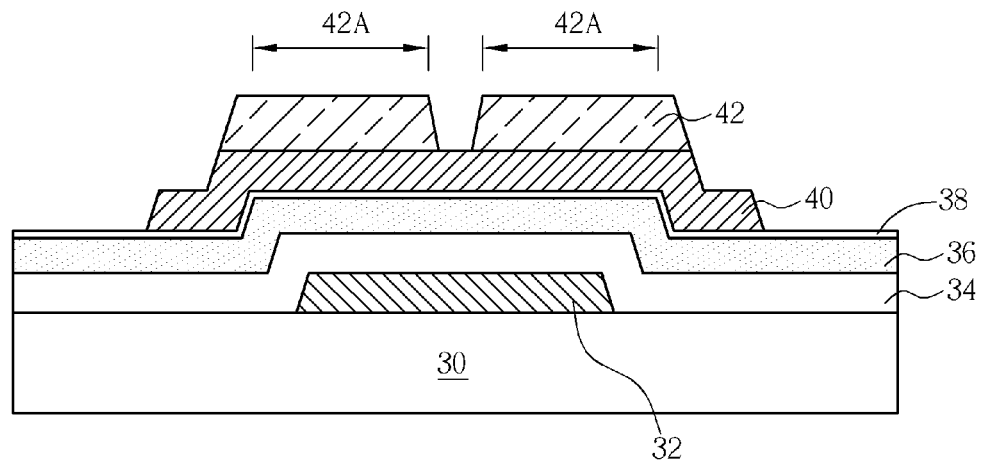

As shown in FIG. 9, an ashing process is carried out upon the photoresist pattern 42 to thin a part of the photoresist pattern 42 in the first thickness region 42A, and to remove another part of the photoresist pattern 42 in the second thickness region 42B and in the third thickness region 42C. Accordingly, the second conductive layer 40 is partially exposed after the ashing process. In this embodiment, the photoresist pattern 42 in the second thickness region 42B and in the third thickness region 42C is entirely removed, so that the semiconductor layer 36 can extend out with respect to other layers in successive process. However, the ashing process can be modified to change the dimension or thickness of the second thickness region 42B and the third thickness region 42C based on different considerations. For example, the photoresist pattern 42 in the second thickness region 42B and the third thickness region 42C can be shrank or thinned in the ashing process, instead of being entirely removed.

Figure 10:
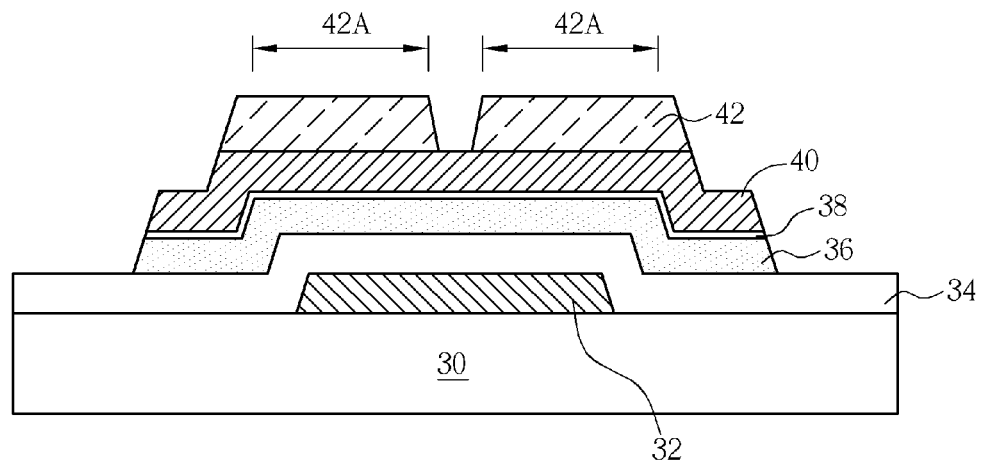

As shown in FIG. 10, the second conductive layer 40 is used as an etching mask to dry etch a part of the ohmic contact layer 38 and a part of the semiconductor layer 36 not covered by the second conductive layer 40.

Figure 11:
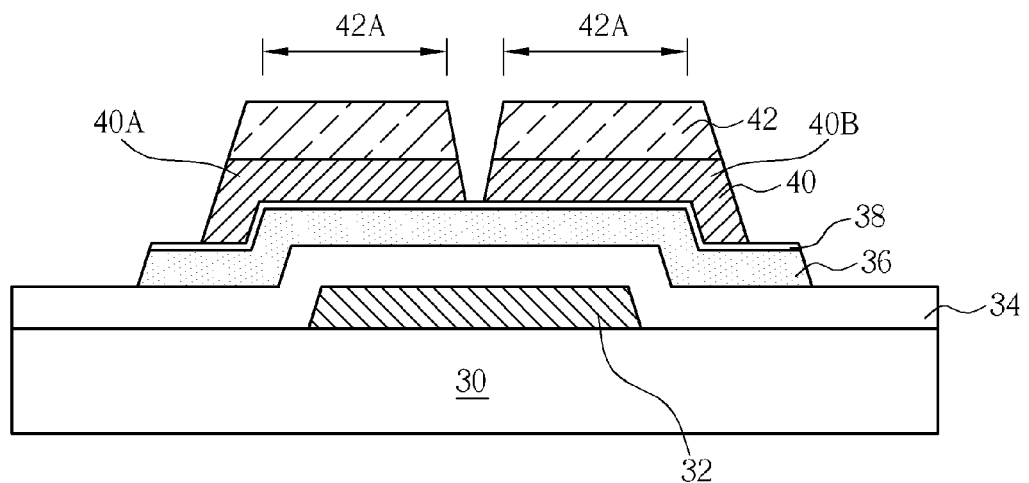

Subsequently, as shown in FIG. 11, the photoresist pattern 42 is used as an etching mask to dry etch at least part of the second conductive layer 40 not covered by the photoresist pattern 42. The etched part of the second conductive layer 40 includes a part of the second conductive layer 40 outside the first thickness region 42A (corresponding to the original second thickness region 42B), and a part of the second conductive layer 40 between the first thickness region 42A (corresponding to the original third thickness region 42C). The remaining second conductive layer 40 forms a source electrode 40A and a drain electrode 40B, and the ohmic contact layer 38 and the semiconductor layer 36 extend out of the edge of the second conductive layer 40. In this embodiment, the outer edges of the source electrode 40A and the drain electrode 40B in a horizontal direction extend out of the first conductive structure 32 which is disposed under the second conductive layer 40 and serves as a gate electrode. In other words, the dimension of the gate electrode is smaller than the dimension of the source electrode 40A and the drain electrode 40B. However, the source electrode 40A and the drain electrode 40B may also draw back from the edges of the first conductive structure 32. In other words, the dimension of the gate electrode may be greater than the dimension of the source electrode 40A and the drain electrode 40B.

Figure 12:
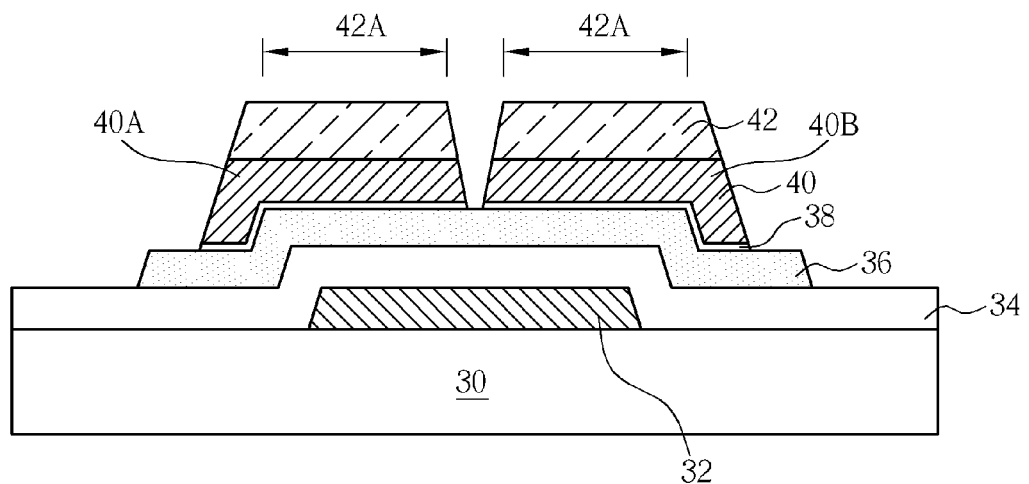

As shown in FIG. 12, a part of the ohmic contact layer 38 not covered by the second conductive layer 40 is dry etched using the photoresist pattern 42 as an etching mask so that the shape of the ohmic contact layer 38 and the shape of the source electrode 40A and the drain electrode are corresponsive, while the semiconductor layer 36 remains extending out of the second conductive layer 40. In the above etching process, a small portion of the semiconductor layer 36 may be etched, but most of the semiconductor layer 36 remains and serves as a channel of the TFT.

Figure 13:
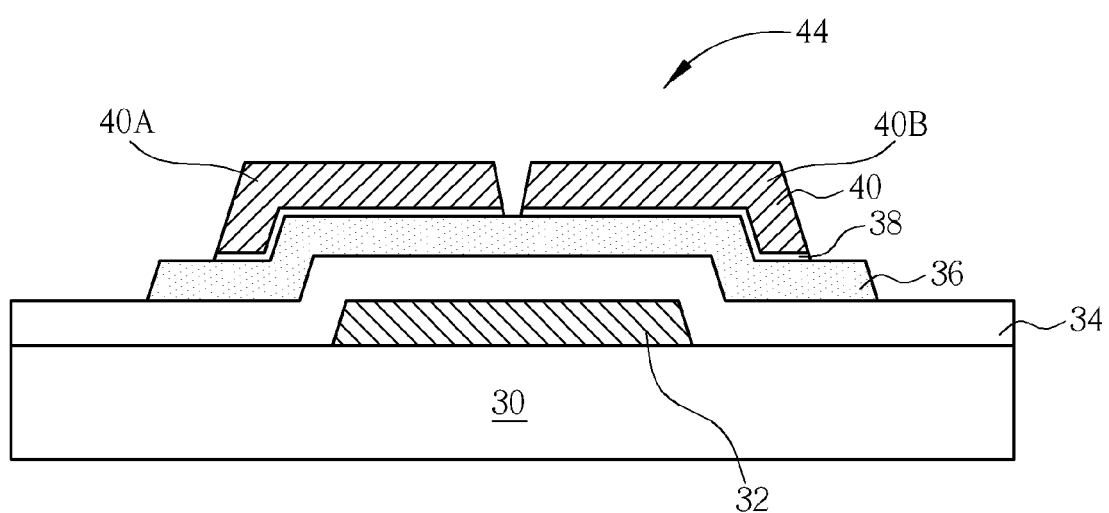

As shown in FIG. 13, the photoresist pattern 42 is removed, and a pull-down transistor 44 of a GOA of a display composed of the first conductive structure (gate electrode) 32, the insulating layer 34, the semiconductor layer 36, the ohmic contact layer 38, the source electrode 40A and the drain electrode 40B is formed on the substrate 30.

Figure 14:
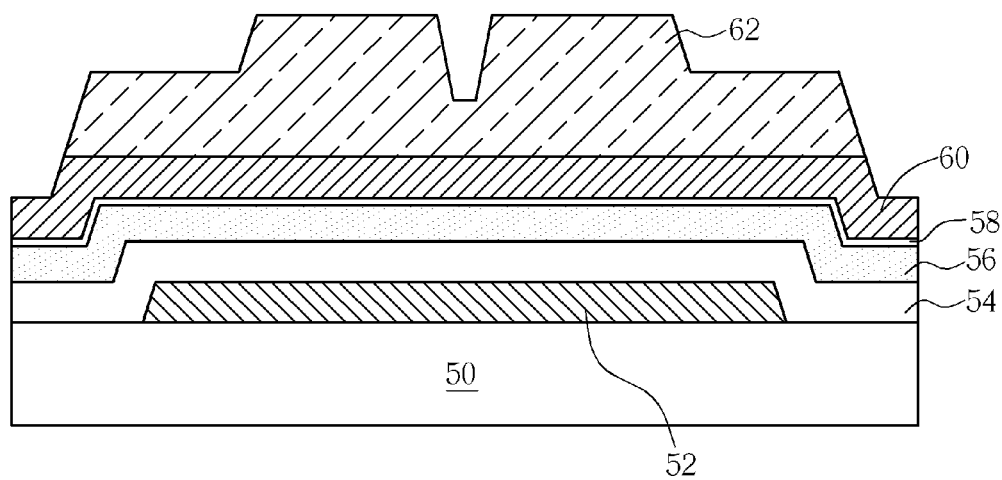
FIGS. 14-20 illustrate a method of forming a pixel transistor of a display according to another embodiment of the present invention.

FIGS. 14-20 illustrate a method of forming a pixel transistor of a display according to another embodiment of the present invention. As shown in FIG. 14, a substrate 50 is provided. A first conductive layer is formed on the substrate 50, and patterned by photolithographic and etching techniques to form a first conductive structure 52 which serves as a gate electrode. Subsequently, an insulating layer 54, a semiconductor layer 56, an ohmic contact layer 58, a second conductive layer 60, and a photoresist pattern 62 are consecutively formed on the first conductive structure 52. In this embodiment, the first conductive structure 52 and the second conductive layer 60 are made of metal material, and the insulating layer 54 serves as a gate insulating layer. The photoresist pattern 62 includes a first thickness region 62A, a second thickness region 62B outside the first thickness region 62A, and a third thickness region 62C substantially corresponding to a central part of the first conductive structure 52. Preferably, the thickness of the second thickness region 62B and the thickness of the third thickness region 62C are smaller than the thickness of the first thickness region 62A, and the thickness of the second thickness region 62B is slightly greater than the thickness of the third thickness region 62C, but not limited. In this embodiment, the thickness of the first thickness region 62A is substantially between 1.5 and 2.5 microns, the thickness of the second thickness region 62B and the third thickness region 62C are both substantially between 5000 and 6000 angstroms. The thickness of the photoresist pattern 62, however, can be modified wherever necessary. In addition, the photoresist pattern 62 may be formed by exposing with a graytone mask such as a halftone mask or a phase shift mask, but not limited.

Figure 15:
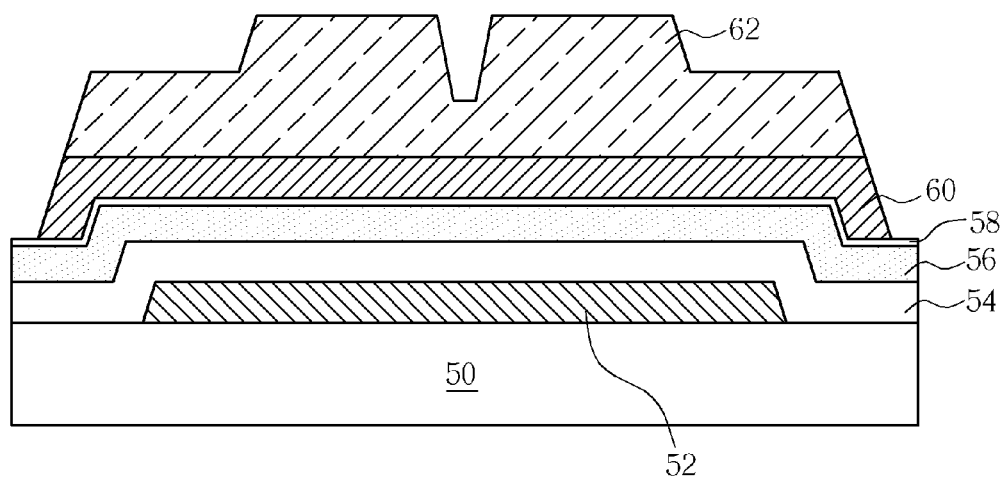

As shown in FIG. 15, a wet etching process is performed using the photoresist pattern 62 as an etching mask to etch a part of the second conductive layer 60 not covered by the photoresist pattern 62, while another part of the second conductive layer 60 covered by the photoresist pattern 62 is remained.

Figure 16:
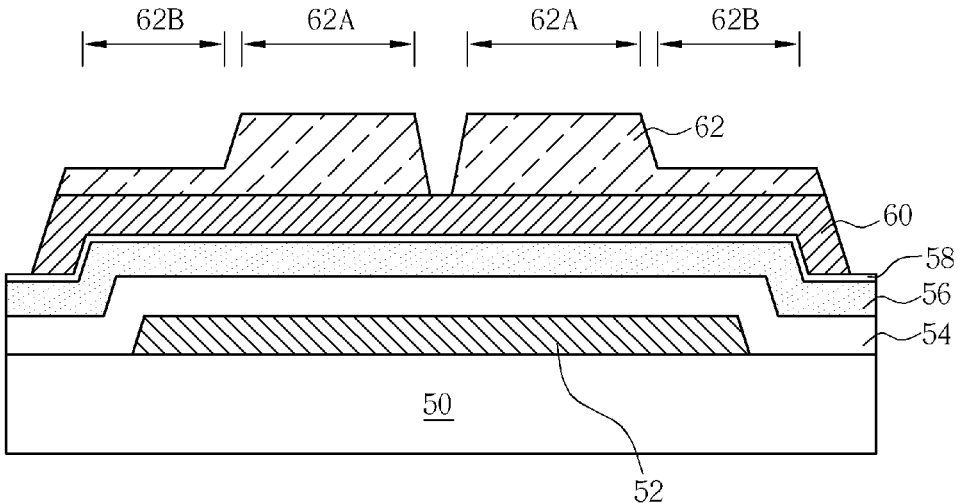

As shown in FIG. 16, an ashing process is carried out upon the photoresist pattern 62 to thin a part of the photoresist pattern 62 in the first thickness region 62A and in the second thickness region 62B, and to remove another part of the photoresist pattern 62 in the third thickness region 62C. After the ashing process, the thickness of the second thickness region 62B is still smaller than the thickness of the first thickness region 62A, and the photoresist pattern 62 partially exposes the second conductive layer 60 (i.e. a part of the second conductive layer 60 corresponding to the original third thickness region 62C). In this embodiment, the photoresist pattern 62 in the second thickness region 62B is not entirely removed, but only the thickness of the second thickness region 62B is shrank so as to prevent metal loss of the second conductive layer 60.

Figure 17:
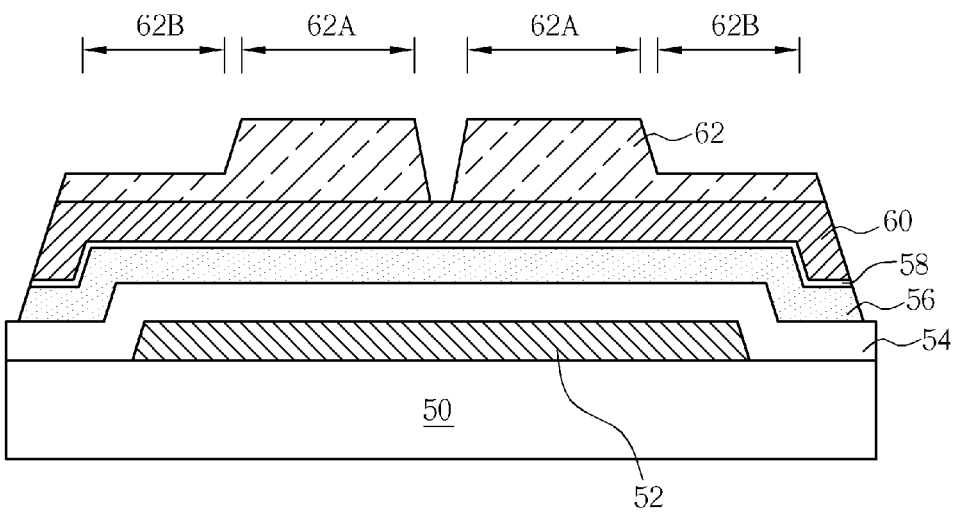

As shown in FIG. 17, a part of the ohmic contact layer 58 and a part of the semiconductor layer 56 not covered by the second conductive layer 60 is dry etched using the second conductive layer 60 as an etching mask.

Figure 18:
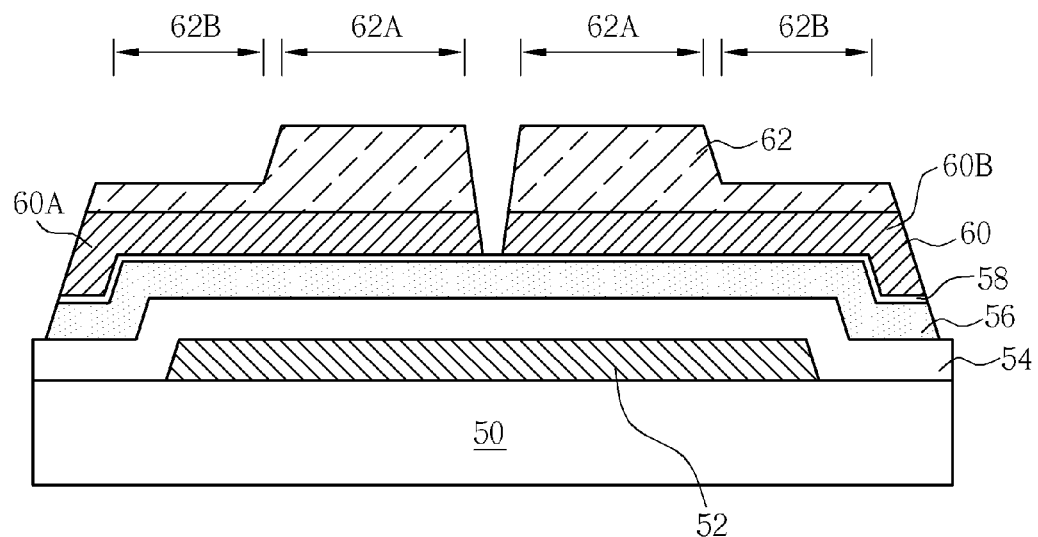

Subsequently, as shown in FIG. 18, a part of the second conductive layer 60 not covered by the first thickness region 62A and the second thickness region 62B of the photoresist pattern 62 is dry etched using the photoresist pattern 62 as an etching mask to remove the part of the second conductive layer 60 between the first thickness region 62A (corresponding to the original third thickness region 62C) for forming a source electrode 60A and a drain electrode 60B. In this embodiment, the outer edges of the source electrode 60A and the drain electrode 60B in a horizontal direction extend out of the first conductive structure 52 which is disposed under the second conductive layer 60 and serves as a gate electrode. In other words, the dimension of the gate electrode is smaller than the dimension of the source electrode 60A and the drain electrode 60B. However, the source electrode 60A and the drain electrode 60B may also draw back from the edges of the first conductive structure 52. In other words, the dimension of the gate electrode may be greater than the dimension of the source electrode 60A and the drain electrode 60B.

Figure 19:
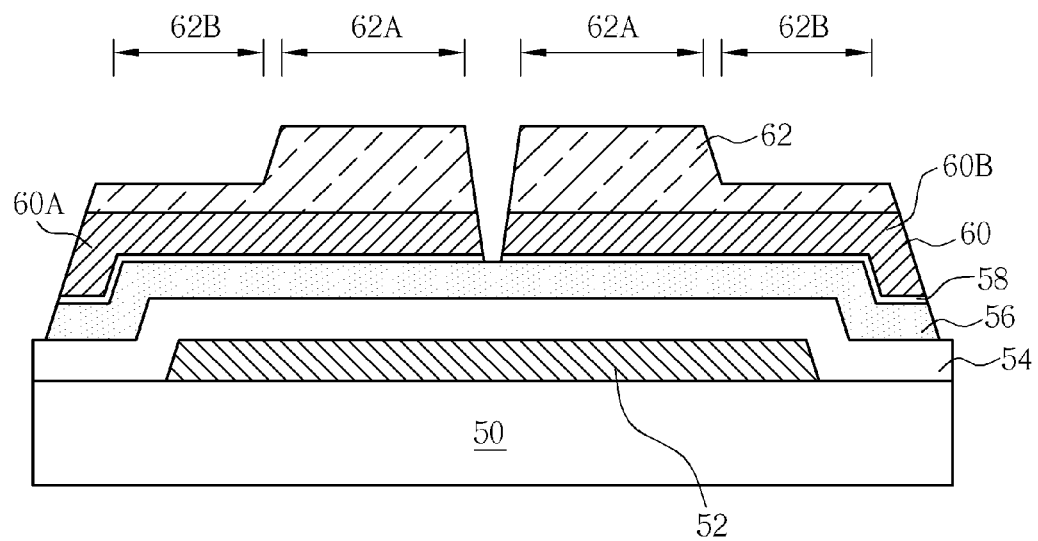

As shown in FIG. 19, the ohmic contact layer 58 is dry etched using the photoresist pattern 62 as an etching mask to remove a part of the ohmic contact layer 58 (not covered by the source electrode 60A and the drain electrode 60B) between the first thickness region 62A so that the shape of the ohmic contact layer 58 and the shape of the source electrode 60A and the drain electrode 60B are corresponsive. In the above etching process, a small portion of the semiconductor layer 56 may be etched, but most of the semiconductor layer 56 remains and serves as a channel of the TFT.

Figure 20:
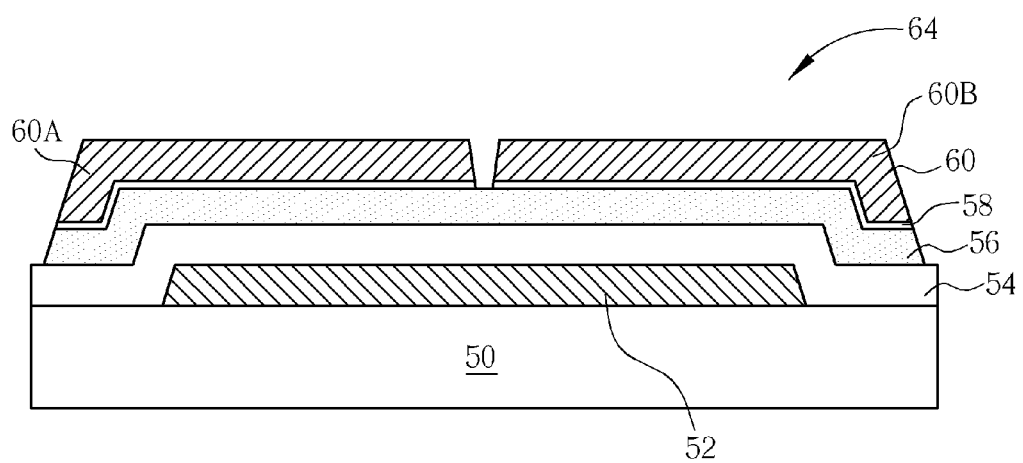

As shown in FIG. 20, the photoresist pattern 62 is removed, and a pixel transistor 64 of a display composed of the first conductive structure (gate electrode) 52, the insulating layer 54, the semiconductor layer 56, the ohmic contact layer 58, the source electrode 60A and the drain electrode 60B is formed.

Figure 21:
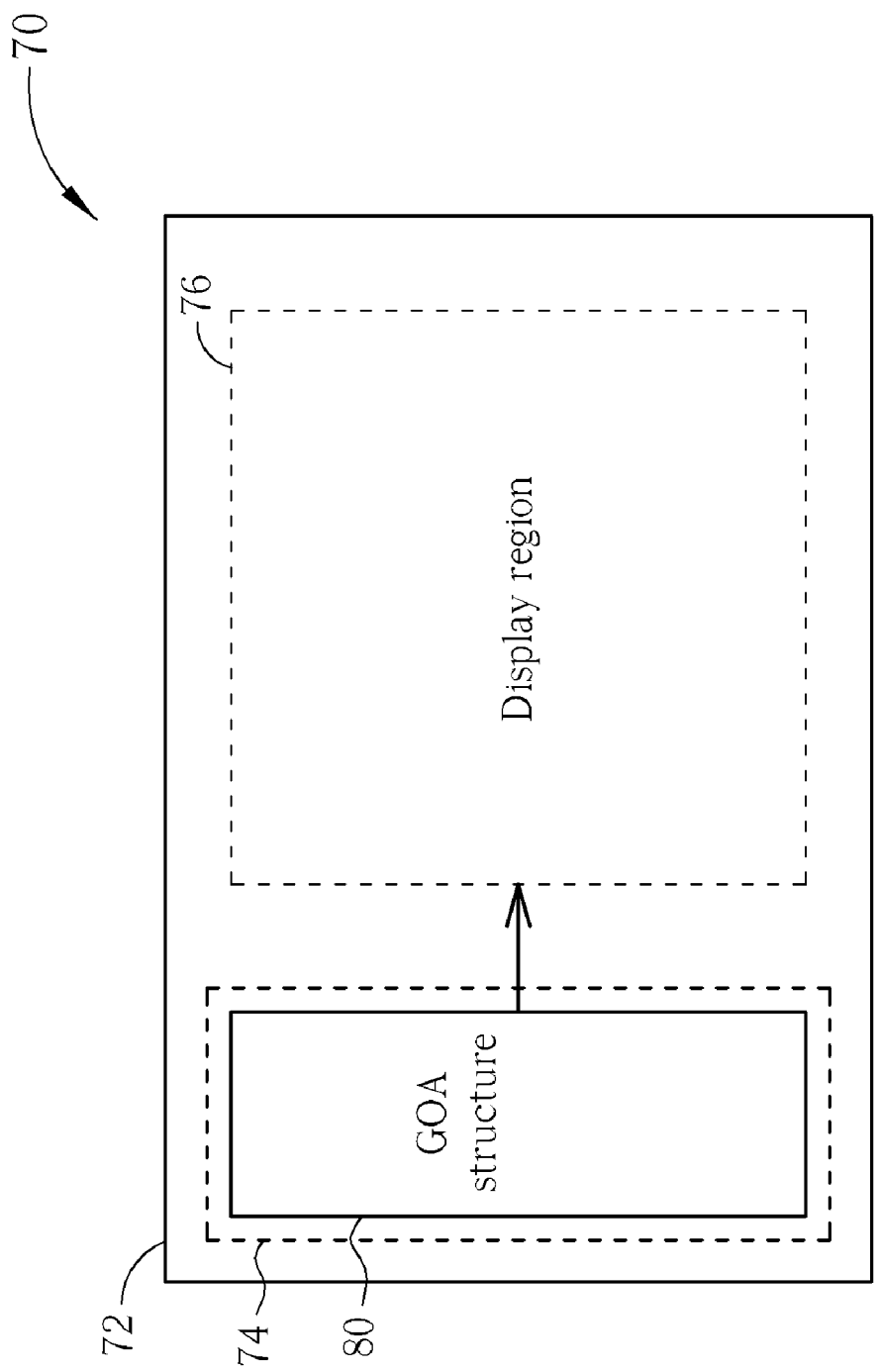
FIGS. 21-23 illustrate a GOA of a display according to a preferred embodiment of the present invention.
Figure 22:
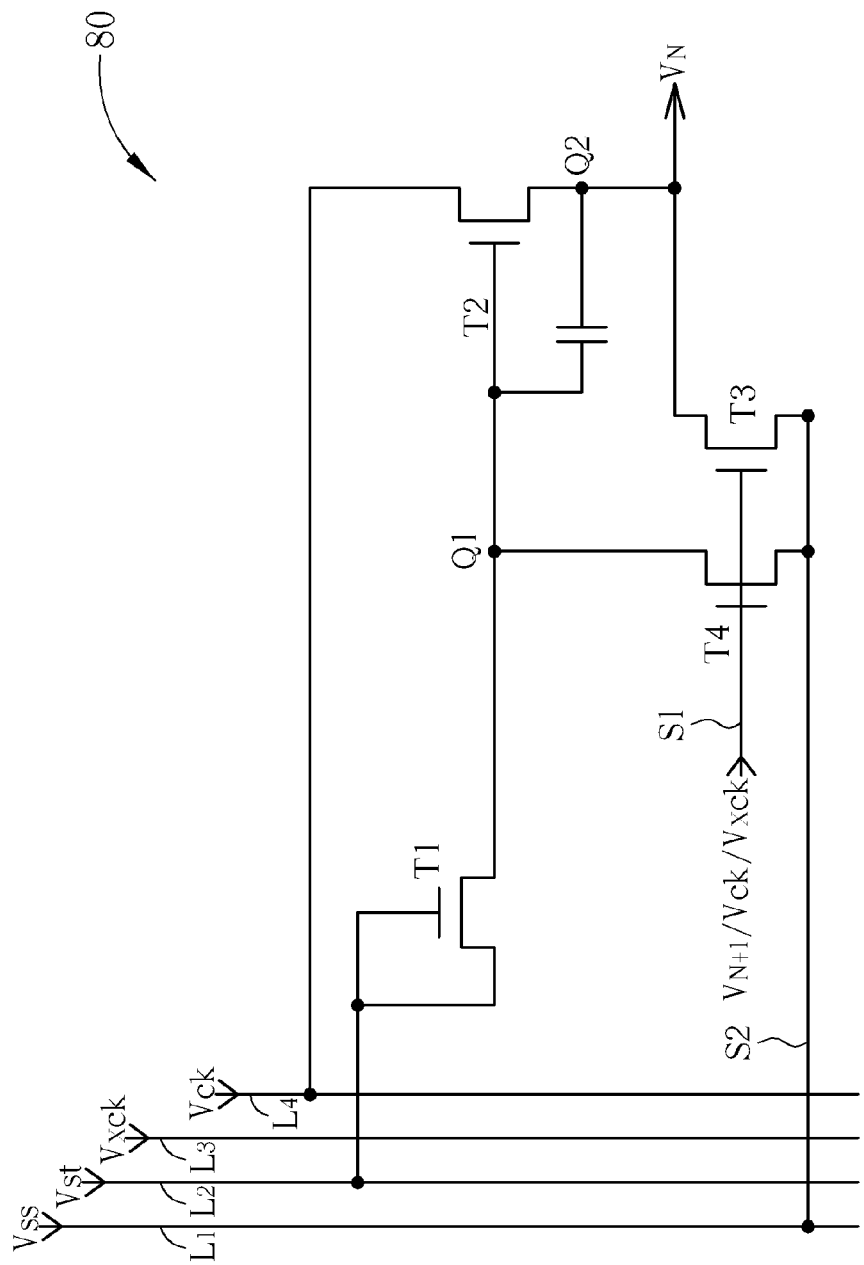
Figure 23:
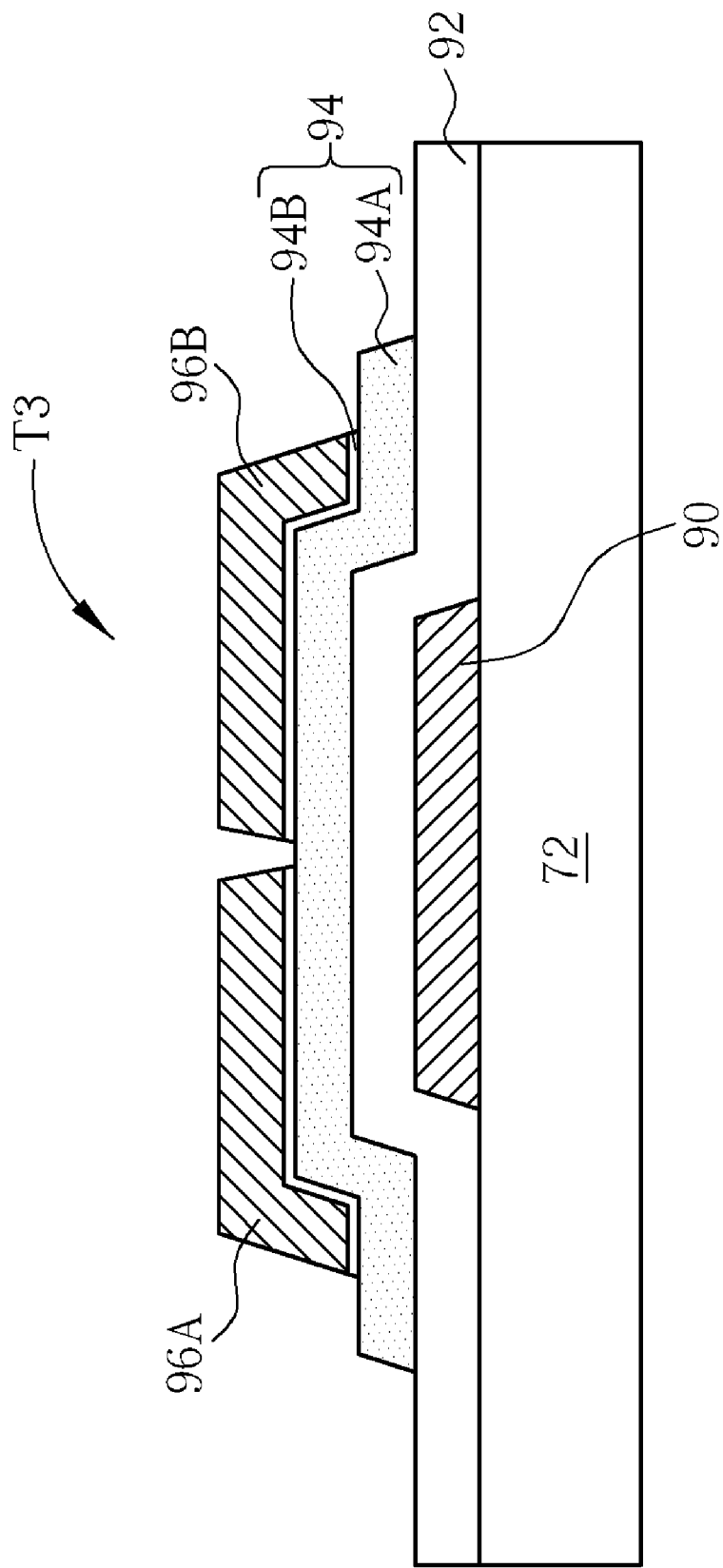

FIGS. 21-23 illustrate a GOA of a display according to a preferred embodiment of the present invention, where FIG. 21 depicts the display, FIG. 22 depicts the GOA, and FIG. 23 depicts a pull-down transistor. The display 70 e.g. an LCD panel includes a substrate 72 having a peripheral region 74 and a display region 76 as shown in FIG. 21. The display 70 includes a GOA structure 80 formed in the peripheral region 74, and the GOA structure 80 includes pull-down transistors T3, T4. As shown in FIG. 23, the pull-down transistor T3 (or T4) includes a gate electrode 90 disposed on the substrate 72, an insulating layer 92 disposed on the substrate 72 and the gate electrode 90, a semiconductor island 94 disposed on the insulating layer 92, a source electrode 96A and a drain electrode 96B disposed on the semiconductor island 94. The semiconductor island 94 includes a semiconductor layer 94A disposed on the insulating layer 92, and a ohmic contact layer 94B between the semiconductor layer 94A, and the source electrode 96A/drain electrode 96B. In this embodiment, the semiconductor island 94 extends out of the edges of the gate electrode 90, and the distance between an edge of the semiconductor island 94 and the corresponding edge of the gate electrode 90 is substantially between 2.5 and 3.5 microns. Also, the semiconductor island 94 may extend out of the edge of the source electrode 96A or the drain electrode 96B, and the distance between an edge of the semiconductor island 94 and the corresponding edge of the source electrode 96A, or the distance between an edge of the semiconductor island 94 and the corresponding edge of the drain electrode 96B is substantially between 4 and 5 microns, preferably but not limited.

As shown in FIG. 22, the GOA structure 80 includes a signal source S1, a negative power source S2, and nodes Q1, Q2. The signal source S1 electrically connects the gate electrode of the pull-down transistors T3, T4, and delivers clock signal Vck, complementary clock signal Vxck, and the voltage signal $V_{N+1}$ of the N+1$_{th}$ to the pull-down transistors T3, T4. The negative power source S2 delivers the voltage signal Vss to the source electrode of the pull-down transistors T3, T4. The node Q1 is electrically connected to the drain electrode of the pull-down transistor T4, and the node Q2 is electrically connected to the drain electrode of the pull-down transistor T3.

In conclusion, the semiconductor island extends out of the gate electrode, and also the source electrode and the drain electrode, and thus improves the pull-down ability of the pull-down transistor of the display. In addition, the method of the present invention uses a photoresist pattern with different thickness to perform photolithographic and etching processes for forming the pull-down transistor and photo spacer stage of the display, and therefore metal loss problem is diminished.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gate driver on array of a display, comprising:
a substrate comprising a peripheral region; and
a gate driver on array structure formed in the peripheral region, the gate driver on array structure comprising a pull-down transistor, and the pull-down transistor comprising a gate electrode, an insulating layer, a semiconductor island, a source electrode, and a drain electrode;
wherein the semiconductor island extends out of both edges of the gate electrode and extends out of an edge of the source electrode and an edge of the drain electrode, and a distance between an edge of the semiconductor island extending out of an edge of the gate electrode and the corresponding edge of the gate electrode is substantially between 2.5 and 3.5 microns.

2. The gate driver on array of a display of claim 1, wherein the gate driver on array structure comprises a signal source electrically connected to the drain electrode.

3. The gate driver on array of a display of claim 1, wherein the gate driver on array structure comprises a negative power source electrically connected to the source electrode.

4. The gate driver on array of a display of claim 1, wherein the gate driver on array structure comprises a node electrically connected to the drain electrode.

5. A gate driver on array of a display, comprising:
a substrate comprising a peripheral region; and
a gate driver on array structure formed in the peripheral region, the gate driver on array structure comprising a pull-down transistor, and the pull-down transistor comprising a gate electrode, an insulating layer, a semiconductor island, a source electrode, and a drain electrode;
wherein the semiconductor island extends out of both edges of the gate electrode and extends out of an edge of the source electrode and an edge of the drain electrode, and a distance between an edge of the semiconductor island extending out of the edge of the source electrode and the corresponding edge of the source electrode is substantially between 4 and 5 microns.

6. The gate driver on array of a display of claim 5, wherein the gate driver on array structure comprises a signal source electrically connected to the drain electrode.

7. The gate driver on array of a display of claim 5, wherein the gate driver on array structure comprises a negative power source electrically connected to the source electrode.

8. The gate driver on array of a display of claim 5, wherein the gate driver on array structure comprises a node electrically connected to the drain electrode.

9. A gate driver on array of a display, comprising:
a substrate comprising a peripheral region; and
a gate driver on array structure formed in the peripheral region, the gate driver on array structure comprising a pull-down transistor, and the pull-down transistor comprising a gate electrode, an insulating layer, a semiconductor island, a source electrode, and a drain electrode;
wherein the semiconductor island extends out of both edges of the gate electrode and extends out of an edge of the source electrode and an edge of the drain electrode, and a distance between an edge of the semiconductor island extending out of the edge of the drain electrode and the corresponding edge of the drain electrode is substantially between 4 and 5 microns.

10. The gate driver on array of a display of claim 9, wherein the gate driver on array structure comprises a signal source electrically connected to the drain electrode.

11. The gate driver on array of a display of claim 9, wherein the gate driver on array structure comprises a negative power source electrically connected to the source electrode.

12. The gate driver on array of a display of claim 9, wherein the gate driver on array structure comprises a node electrically connected to the drain electrode.

* * * * *